United States Patent
Speake

(10) Patent No.: US 6,272,330 B1
(45) Date of Patent: Aug. 7, 2001

(54) RADIO RECEIVER AND GAIN CONTROLLED AMPLIFIER THEREFOR

(75) Inventor: John D. Speake, Cambridge (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/260,342

(22) Filed: Mar. 2, 1999

(30) Foreign Application Priority Data

Mar. 11, 1998 (GB) .................................................. 9805148

(51) Int. Cl.[7] ........................................................ H04Q 7/20
(52) U.S. Cl. ........................ 455/341; 455/311; 455/343; 330/124 R
(58) Field of Search ..................................... 455/307, 311, 455/313, 338, 339, 341, 343; 330/2, 51, 124 R, 129, 295, 149

(56) References Cited

U.S. PATENT DOCUMENTS

| | | | |
|---|---|---|---|
| 5,561,395 | 10/1996 | Melton et al. | 330/2 |
| 5,872,481 | * 2/1999 | Sevic et al. | 330/51 |
| 5,903,854 | * 5/1999 | Abe et al. | 330/124 R |
| 5,973,559 | * 10/1999 | Alberty | 330/124 R |
| 5,990,738 | * 11/1999 | Wright et al. | 330/149 |
| 6,054,894 | * 4/2000 | Wright et al. | 330/295 |

FOREIGN PATENT DOCUMENTS

0795967A1  9/1997  (EP) ................................. H04B/1/16

* cited by examiner

Primary Examiner—Nay Maung
(74) Attorney, Agent, or Firm—Jack D. Slobod

(57) ABSTRACT

A gain controlled radio receiver for a selective call system, includes a multi-step gain controlled RF amplifier (44) coupled to receive an input signal and a measuring circuit (42) for measuring the level of a wanted frequency down converted signal. The multi-step gain controlled amplifier (44) has an input terminal (RIP, RIN), N gain stages (76A to 76E), where N is an integer of at least 2, having outputs coupled to a common output stage (82). A first of the N gain stages (76A) is coupled to the input terminal (RIP, RIN), and an (N−1) stage capacitive ladder attenuator (86) has an input coupled to the input terminal and outputs coupled respectively to an input of each of the second to Nth gain stages (76B to 76E). The measuring circuit (42) has a level control output (45) for switching-on a selected one of the gain stages which provides an amplified signal to the common output stage for frequency down conversion and demodulation.

13 Claims, 2 Drawing Sheets

RADIO RECEIVER AND GAIN CONTROLLED AMPLIFIER THEREFOR

BACKGROUND OF THE INVENTION

1. Field of the Invention

The present invention relates to a radio receiver and particularly to a gain controlled amplifier for use in a radio receiver. The radio receiver or gain controlled amplifier may be fabricated from discrete components or as an integrated circuit. In its integrated form, the radio receiver and the gain controlled amplifier can be used in battery powered communications apparatus such as digital pagers and cellular/cordless telephones.

2. Description of the Related Art

For convenience of description the present invention will be described with reference to an integrated receiver for use in a digital pager.

Frequently low power receivers used in applications such as digital paging do not incorporate automatic gain control (AGC). However there are situations, such as when receiving signals in an environment where there are a plurality of very high powered transmitters on nearby channels within the receiver RF bandwidth, that the receiver circuit can be saturated. When the wanted signal amplitude is high enough to allow RF gain reduction AGC provides a means of reducing the received input signal to manageable levels based on the fact that unwanted products caused by large interferers reduce by square or cubic laws, whereas the wanted signal decreases linearly. It is known from European Patent Specification EP-A-0 795 967 to provide AGC to the input stage of a radio receiver to attenuate excessively large input RF signals. This known solution requires a PIN diode which is not readily integratable.

OBJECT AND SUMMARY OF THE INVENTION

An object of the present invention is to provide integratable AGC system in a low power radio receiver.

According to one aspect of the present invention there is provided a receiver comprising means for receiving an input signal, a multi-step gain controlled RF amplifier coupled to said receiving means, means for frequency down-converting the amplified signal, means for measuring the level of a wanted signal, and means for demodulating said signal, characterised in that the multi-step gain controlled amplifier comprises an input terminal, a plurality of N gain stages, where N is an integer of at least 2, having outputs coupled to a common output, a first of the N gain stages being coupled to said input terminal, and an (N−1) stage capacitive ladder attenuator having an input coupled to the input terminal and outputs coupled respectively to an input of each of the second to Nth gain stages, and in that said measuring means has a level control output for switching-on a selected one of the gain stages.

According to a second aspect of the present invention there is provided a gain controlled amplifier comprising an input terminal, a plurality of N gain stages, where N is an integer of at least 2, having outputs coupled to a common output, a first of the N gain stages being coupled to said input terminal, an (N−1) stage capacitive ladder attenuator having an input coupled to the input terminal and outputs coupled respectively to an input of each of the second to Nth gain stages, and switching means responsive to an external signal for switching-on a selected one of the gain stages.

The receiver or amplifier made in accordance with the present invention may be fabricated as an integrated circuit not requiring any external AGC components.

When operating in a gain reduction state, the multi-step, gain controlled amplifier can have a high degree of linearity and low gain but have a low noise, high gain whenever the AGC is not active.

If desired the gains of the gain stages may be identical or they may be different, depending on the application. The attenuation of each of the stages of the capacitive ladder attenuator may be identical or may differ depending on the application.

An advantage of using a capacitive ladder attenuator is that it is essentially a multiband device because although its overall reactance will change with frequency, the relative reactance ratios are maintained.

BRIEF DESCRIPTION OF THE DRAWINGS

The present invention will now be described, by way of example, with reference to the accompanying drawing, wherein.

In the drawing the same reference numerals have been used to indicate corresponding features.

DETAILED DESCRIPTION OF THE PREFERRED EMBODIMENT

Figure 1:
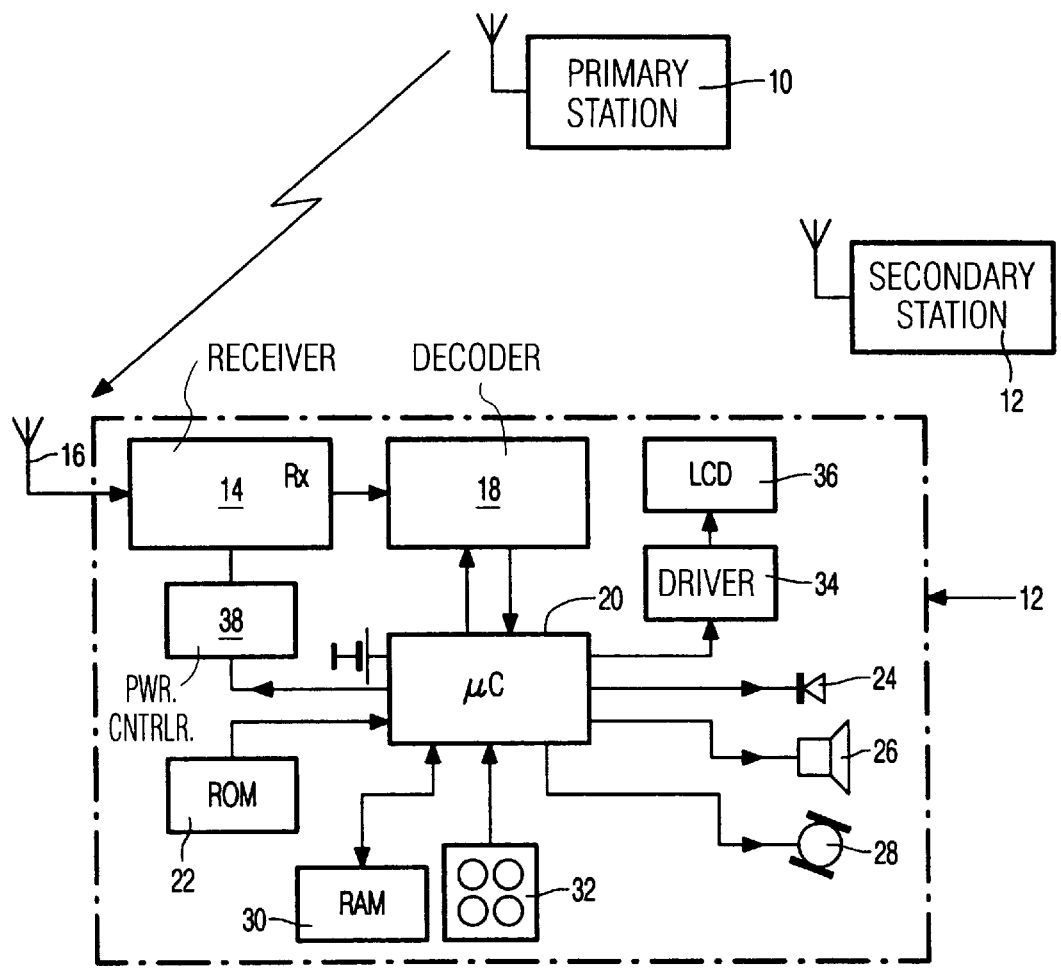
FIG. 1 is a block schematic diagram of a selective call system comprising a primary station and a plurality of secondary stations.

Referring to FIG. 1, the selective call system comprises a primary station 10 which includes a system controller which is programmed to operate the system in accordance with a suitable protocol. In the case of a one-way paging system the protocol may be POCSAG, otherwise known as the CCIR Radiopaging Code No. 1.

A plurality of secondary stations 12 are provided, which stations are able to roam relative to the primary station 10. The secondary station 12 typically comprises a receiver 14 having an antenna 16 for detecting transmissions from the primary station 10. A decoder 18 is coupled to an output of the receiver 14 and to a microcontroller 20. Optionally the decoder 18 may be omitted and a decoding function is implemented in software in the microcontroller 20. The microcontroller 20 is operated in accordance with a program stored in a read only memory (ROM) 22. Annunciating devices comprising a light emitting diode 24, an acoustic transducer 26 and/or a vibrator motor 28 are coupled to the microcontroller 20. It will be assumed that the secondary station 12 is a message pager in which incoming messages are stored in a random access memory (RAM) 30 and are recalled by a user activating the keys of a keypad 32 and supplied by a driver 34 for display on a LCD panel 36. Battery economising is effected by means of a power controller 38 coupled to the microcontroller 20 on the one hand and to the receiver 14 on the other hand.

Although the POCSAG paging protocol is well known it is probably sufficient to say that pager messages to secondary stations are transmitted in one of eight time frames which collectively constitute a batch which begins with a synchronisation codeword. Each pager is allocated to one of the 8 time frames so that it need only be energised to receive the synchronisation code word and for the duration of its frame. For the remainder of the time it may be in a powered-down or sleep mode in which the receiver and perhaps some of the microcontroller functions are switched off.

Figure 2:
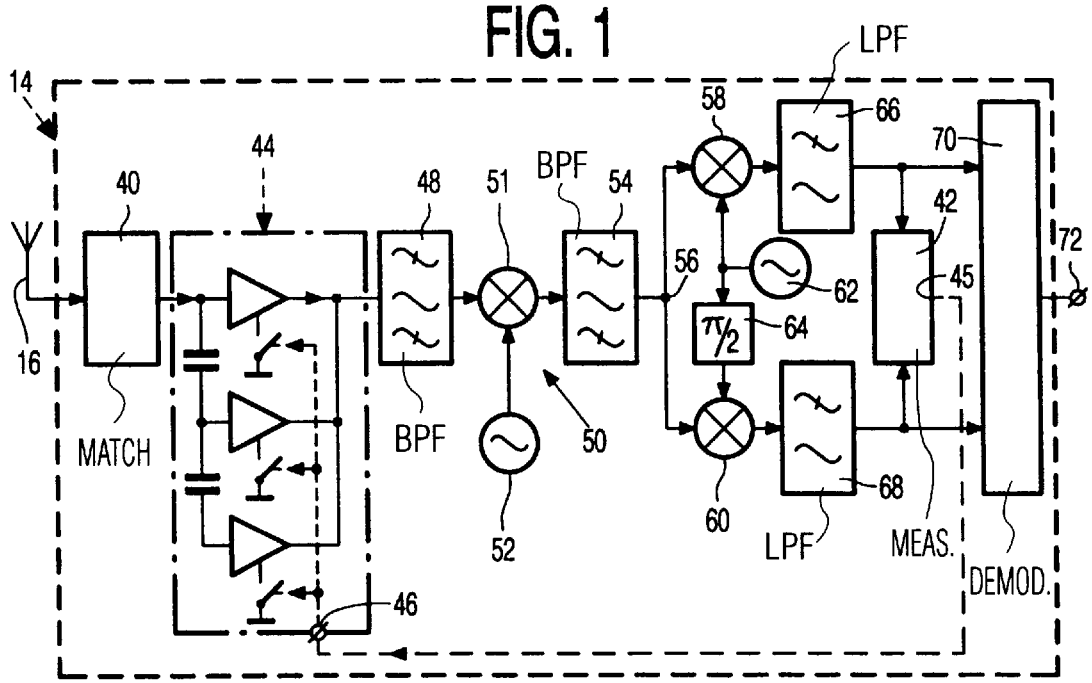
FIG. 2 is a block schematic diagram of a radio receiver used in a secondary station.

The receiver 14 shown in FIG. 2 comprises a superhet stage coupled to a zero IF stage. More particularly an input matching network 40 is coupled to the antenna 16 providing an optimum power/noise match. An automatic gain controlled RF amplifier 44 to be described later with reference to FIG. 3 is coupled to the input matching network 40.

A bandpass filter 48 is coupled to an output of the RF amplifier 44, an output from which is coupled to a superhet frequency down-conversion stage 50. The stage 50 comprises a mixer 51 having inputs connected to the output of the bandpass filter 48 and to a local oscillator 52 and an output coupled to another bandpass filter 54 for selecting the IF signal. The IF signal is supplied to a signal splitter 56 of a zero IF stage comprising quadrature related channels comprising mixers 58, 60 each having an input coupled to the signal splitter 56 and a second input for a local oscillator signal derived from a local oscillator 62, the phase of the local oscillator signal applied to the mixer 60 being shifted by ninety degrees in a phase shifter 64. Low pass filters 66, 68 respectively select the zero IF products of mixing at the outputs of the mixers 58, 60 thereby providing the majority of the selectively (or frequency discrimination) against all unwanted signals outside the wanted signal bandwidth. The selected products of mixing are supplied to a demodulator 70 which supplies the signal for decoding on an output 72. A measuring stage 42 for measuring the level of the wanted signal has inputs coupled to the signal paths between the low pass filters 66, 68 and the demodulator 70. The measuring stage has a control output 45 coupled to a level control input 46 of the RF amplifier 44.

Figure 3:
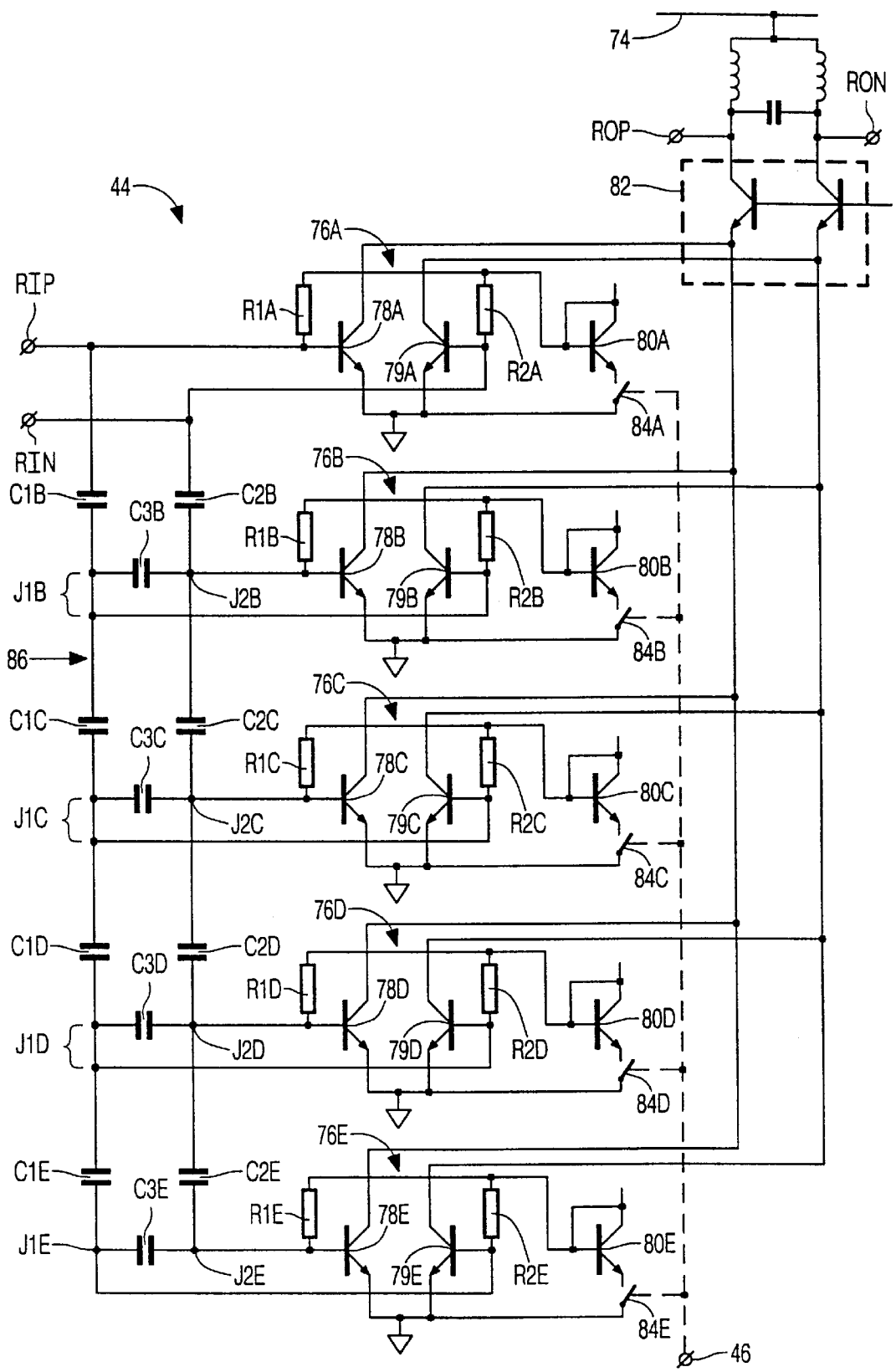
FIG. 3 is a block schematic diagram of an embodiment of a RF amplifier used in the radio receiver shown in FIG. 2.

FIG. 3 illustrates the multi-step gain controlled RF amplifier 44 operating from a 1.0 volt stabilised supply line 74. The amplifier 44 is fabricated as an integrated circuit.

The amplifier 44 comprises N, where N=5, differential input amplifier stages 76A to 76E. The construction of each differential amplifier stages is the same so that for the convenience of description only the stage 76A will be described but the corresponding components in the other stages 76B to 76E will be identified by the respective lettered suffix.

The differential input amplifier stage 76A comprises emitter coupled NPN transistors 78A, 79A and a further NPN transistor 80A whose collector-base electrodes are interconnected to form a voltage source. The emitter electrodes of the transistors 78A, 79A and 80A are coupled to ground. The base electrodes of the transistors 78A, 79A are coupled to respective signal inputs RIP and RIN. The base bias current for the transistors 78A, 79A is derived by way of respective 10 KΩ resistors RIA, R2A from the base electrode of the transistor 80A. The collector electrodes of the transistors 78A, 79A are coupled to a common output stage 82 for all the stages 76A to 76E. A switch 84A to 84E is shown diagrammatically in the emitter circuit of each of the transistors 80A to 80E. A control signal on the input 46 will effect dc switching of the bias supply so that only one input stage is active at any one time.

A capacitive ladder attenuator 86 is coupled to the input stages of the differential input amplifier stages 76B to 76E. The capacitive ladder attenuator 86 comprises capacitors C1B to C1E and C2B to C2E connected is series to the inputs RIP and RIN, respectively. Junctions J1B to J1E of the capacitors C1B, C1C, C1D and C1E are respectively coupled to the base electrodes of the transistors 79B to 79E. Junctions J2B to J2E of the capacitors C2B, C2C, C2D and C2E are respectively coupled to the base electrodes of the electrodes 78B to 78E. Capacitors C3B to C3E respectively interconnect the pairs of junctions J1B, J2B; J1C, J2C; J1D, J2D and J1E, J2E. The input capacitive reactance added by the capacitive ladder is compensated for in the design of the input matching network 40 (FIG. 2).

The capacitive divider steps are chosen by design requirements and may be even or uneven, for example vary according to a predetermined progression. A typical even value step is of the order of 6 to 8 dB. In an embodiment having up to six input stages and operating at frequencies of up to 930 MHz, the values of the capacitors C1B to C1E and C2B to C2E are of the order of 2pF and the capacitors C3B to C3E are of the order of 1 pF. A feature of the capacitive ladder attenuator 86 is that the relative reactance ratios are maintained in spite of the fact that the actual reactance changes with frequency.

The first differential input amplifier stage 76A has no attenuator section in front of it and therefore is able to operate at minimum noise figure and maximum gain. The second stage 76B is protected by the first attenuator, that is capacitors C1B, C2B, C3B, and its noise figure is increased by that attenuation factor and the gain is lowered by the corresponding amount.

The third stage 76C is protected by the first and second attenuators, that is capacitors C1B, C2B, C3B and C1C, C2C, C3C, respectively, and so on. Because stages 76B to 76E are protected by the passive networks, it is possible to reduce the power consumption of the later stages, as they are well protected by the attenuators.

Various combinations of relative amplifier currents and attenuator step sizes may be chosen. The amplifier stages 76A to 76E may comprise gain blocks of any suitable amplifier configuration and may be fabricated in any suitable technologies including FET and MOS. Further the gain blocks may be unbalanced with an unbalanced capacitive ladder attenuator 86.

The RF amplifier illustrated in FIG. 3 may be used in any suitable application.

From reading the present disclosure, other modifications will be apparent to persons skilled in the art. Such modifications may involve other features which are already known in the design, manufacture and use of receivers, RF amplifiers and component parts thereof and which may be used instead of or in addition to features already described herein.

What is claimed is:

1. A receiver comprising means for receiving an input signal, a multi-step gain controlled RF amplifier coupled to said receiving means, means for frequency down-converting the amplified signal, means for measuring the level of a wanted signal, and means for demodulating said signal, wherein the multi-step gain controlled RF amplifier comprises an input terminal, an N−1 stage ladder attenuator having an input coupled to the input terminal and having N−1 successive outputs, where N is an integer of at least 2, each stage of said ladder attenuator having an attenuation step to produce progressively increased attenuation between the input terminal and each successive one of the N−1 outputs, N gain stages having outputs coupled to a common output, a first of the gain stages having an input coupled to said input terminal and the second to Nth of the gain stages having an input coupled to a different one of the N−1 outputs of the ladder attenuator, and said measuring means has a level control output for switching-on a selected one of the gain stages.

2. A receiver as claimed in claim 1, wherein said gain stages have substantially identical gains.

3. A receiver as claimed in claim 2, wherein the attenuation steps of the stages of the ladder attenuator are substantially identical.

4. A receiver as claimed in claim 2, wherein the ladder attenuator is a broadband device.

5. A receiver as claimed in claim 1, wherein the attenuation steps of the stages of the ladder attenuator are substantially identical.

6. A receiver as claimed in claim 5, wherein the ladder attenuator is a broadband device.

7. A receiver as claimed in claim 1, wherein the ladder attenuator is a broadband device.

8. A receiver as claimed in claim 1, wherein each gain stage comprises a differential input amplifier and a base bias current supply circuit, and the control output of the measuring means is used to switch the base bias current supply on and off, as required.

9. A gain controlled amplifier comprising an input terminal, an N−1 stage ladder attenuator having an input coupled to the input terminal and having N−1 successive outputs, where N is an integer of at least 2, each stage of said ladder attenuator having an attenuation step to produce progressively increased attenuation between the input terminal and each successive one of the N−1 outputs, N gain stages having outputs coupled to a common output, a first of the gain stages having an input coupled to said input terminal and the second to Nth of the gain stages having an input coupled to a different one of the N−1 outputs of the ladder attenuator, and switching means responsive to an external signal for switching-on a selected one of the gain stages.

10. An amplifier as claimed in claim 9, wherein each said gain stage comprises a differential input amplifier and a base bias current supply circuit, and the switching means switches the base bias current supply on and off, as required.

11. An amplifier as claimed in claim 6, embodied in an integrated circuit.

12. An amplifier as claimed in claim 11, wherein each gain stage comprises a differential input amplifier and a base bias current supply circuit, and the switching means switches the base bias current supply on and off, as required.

13. A gain controlled amplifier comprising an input terminal, an N−1 stage ladder attenuator having an input coupled to the input terminal and having N−1 successive outputs, where N is an integer of at least 2, each stage of said ladder attenuator having an attenuation step to produce progressively increased attenuation between the input terminal and each successive one of the N−1 outputs, and N selectively activatable gain stages having outputs coupled to feed to a common output, a first of the gain stages having an input coupled to said input terminal and the second to Nth of the gain stages having an input coupled to a different one of the N−1 outputs of the ladder attenuator.

* * * * *